(12) United States Patent
Takewaki et al.

(10) Patent No.: US 7,633,138 B2
(45) Date of Patent: Dec. 15, 2009

(54) SEMICONDUCTOR DEVICE AND METHOD OF MANUFACTURING THE SAME

(75) Inventors: Toshiyuki Takewaki, Kanagawa (JP); Takeshi Toda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 333 days.

(21) Appl. No.: 11/502,429

(22) Filed: Aug. 11, 2006

(65) Prior Publication Data

US 2007/0034924 A1 Feb. 15, 2007

(30) Foreign Application Priority Data

Aug. 12, 2005 (JP) ............... 2005-234676

(51) Int. Cl.
*H01L 21/8242* (2006.01)

(52) U.S. Cl. ............... 257/535; 257/E29.343; 257/E23.144; 438/253

(58) Field of Classification Search ........ 257/311, 257/535, E29.343
See application file for complete search history.

(56) References Cited

U.S. PATENT DOCUMENTS

| | | | |
|---|---|---|---|
| 6,391,713 B1 * | 5/2002 | Hsue et al. ............... | 438/253 |
| 6,548,902 B2 | 4/2003 | Suzuki | |
| 2005/0009374 A1 * | 1/2005 | Gao et al. ............... | 438/796 |
| 2005/0161765 A1 | 7/2005 | Tsau | |

FOREIGN PATENT DOCUMENTS

| | | |
|---|---|---|
| JP | 2002-353324 | 12/2002 |
| JP | 2003-258107 | 9/2003 |

OTHER PUBLICATIONS

Noguchi J. et al.: "Influence of Post-CMP Cleaning on Cu Interconnects and TDDB Reliability" IEEE Transactions on Electron Devices, vol. 52, No. 5, May 2005. pp. 934-941.

\* cited by examiner

*Primary Examiner*—Minh-Loan T Tran
*Assistant Examiner*—Maria Ligai
(74) *Attorney, Agent, or Firm*—Young & Thompson (57) ABSTRACT

The semiconductor device 1 includes an insulating interlayer 10, interconnects 12a to 12c, an insulating interlayer 20, and a capacitor element 30. On the insulating interlayer 10 and the interconnects 12a to 12d, the insulating interlayer 20 is provided via a diffusion barrier 40. On the insulating interlayer 20, the capacitor element 30 is provided. The capacitor element 30 is a MIM type capacitor element, and includes a lower electrode 32 provided on the insulating interlayer 20, a capacitor insulating layer 34 provided on the lower electrode 32, and an upper electrode 36 provided on the capacitor insulating layer 34. The interface S1 between the insulating interlayer 20 and the capacitor element 30 is generally flat. The lower face S2 of the insulating interlayer 20 includes an uneven portion at a position corresponding to the capacitor insulating layer 34.

5 Claims, 8 Drawing Sheets

SEMICONDUCTOR DEVICE AND METHOD OF MANUFACTURING THE SAME

This application is based on Japanese patent application No. 2005-234676, the content of which is incorporated hereinto by reference.

BACKGROUND

1. Technical Field

The present invention relates to a semiconductor device and a method of manufacturing the same.

2. Related Art

Recently, Metal-Insulator-Metal (hereinafter, MIM) type capacitor elements, having significantly smaller parasitic resistance and parasitic capacitance than conventional MOS type capacitor elements, have come to be popularly used. The MIM type capacitor element can also be incorporated in a logic device thus constituting one single piece of chip. To achieve such structure, the structure and manufacturing process of the both devices have to be integrated. The logic devices generally include interconnects stacked in multiple layers. Accordingly, it is a critical technical issue how to adapt the structure and process of the MIM type capacitor element to the multilayer interconnect structure. From such viewpoint, a process has been developed through which an electrode of the MIM type capacitor element is formed by a similar method to build up the multilayer interconnect structure of the logic device.

The MIM type capacitor element is, in most conventional cases, formed in a region under which no interconnect is provided as described in Japanese Laid-open patent publication No. 2003-258107, and is seldom formed above a region where fine interconnects are densely provided.

SUMMARY OF THE INVENTION

However, now that much higher degree of integration has been achieved, it has become necessary to form the MIM type capacitor element semiconductor device in an upper layer of a region where interconnects are densely provided, in order to reduce the size of the semiconductor device. In this regard, the present inventors have ascertained that the following issues have to be overcome.

Currently, copper is popularly employed to constitute the multilayer interconnect in the logic device, because of the low resistance of copper. Copper is quite difficult to be processed by dry etching, when compared with aluminum, for example. Accordingly, Damascene process is usually employed for forming the copper interconnect. In the Damascene process, firstly a trench is formed in an insulating layer such as a silicon oxide layer, after which a barrier metal layer is formed to block diffusion of copper. Then the trench is filled with copper by plating for example, followed by a chemical mechanical polishing (hereinafter, CMP), thereby forming the interconnect.

The surface of the interconnect, as well as the surface of the insulating layer in the vicinity thereof, shaped upon removal of the excessive copper and barrier metal by the CMP process, has been considered to be flat. Upon strict observation, however, it has been discovered that a steep difference in level is formed at an edge portion of the interconnect, as disclosed in the following document (Ref. FIGS. 4 and 10): J. Noguchi et al., "Influence of Post-CMP Cleaning on Cu Interconnects and TDDB Reliability", IEEE TRANSACTIONS ON ELECTRON DEVICES, Vol. 52, No. 5, May 2005, pp. 934-941 (non-patent document 1).

Figure 7A:
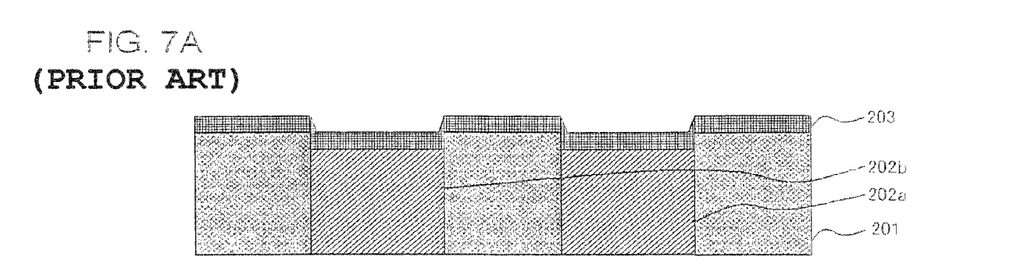
FIGS. 7A and 7B are cross-sectional views showing a conventional semiconductor device, for explaining a drawback thereof.
Figure 7B:
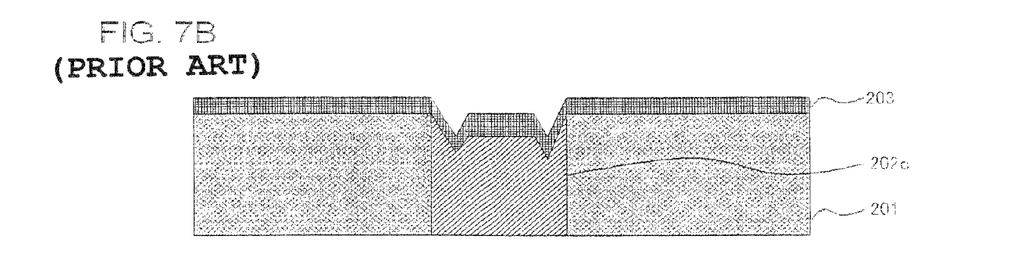

FIGS. 7A and 7B are cross-sectional views schematically showing an interconnect with such difference in level. Interconnects 202a, 202b, 202c in an oxide layer 201 shown in these drawings are constituted of copper through single-Damascene process. On the interconnects 202a, 202b, 202c, a cap layer (diffusion barrier) 203 is provided.

As shown, a difference in level is formed on the upper surface of the interconnects 202a, 202b, 202c. Suspected causes include dishing that takes place during the CMP process, and etching or corrosion that takes place during the cleaning after the CMP process, as described in the non-patent document 1. The depth of the difference in level, which partly depends on processing conditions for forming the interconnect, may reach 50 to even a hundred and scores of nanometers. As shown in FIG. 7B, a particularly steep difference in level is seen at an edge portion in the isolated interconnect 202c.

Figure 8A:
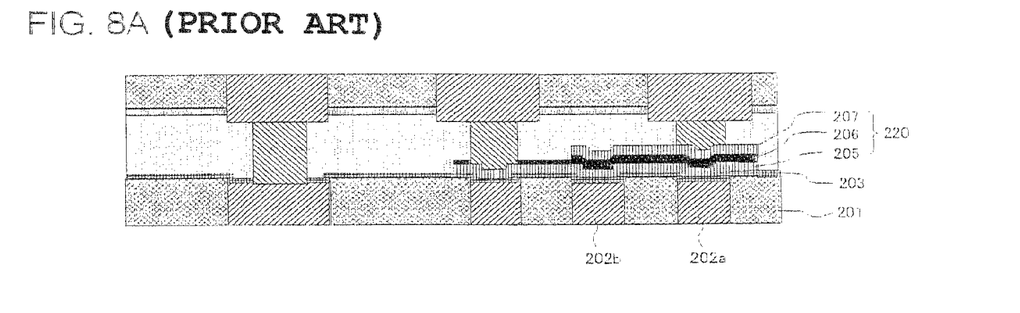
FIGS. 8A to 8C are cross-sectional views showing the conventional semiconductor device, for explaining the drawback thereof.
Figure 8B:
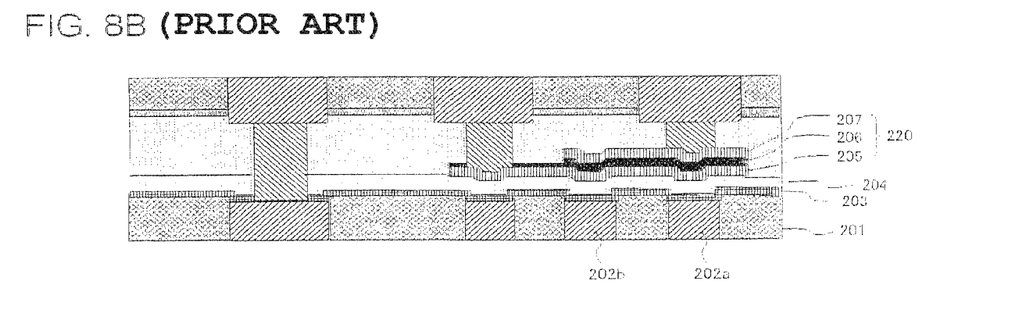
Figure 8C:
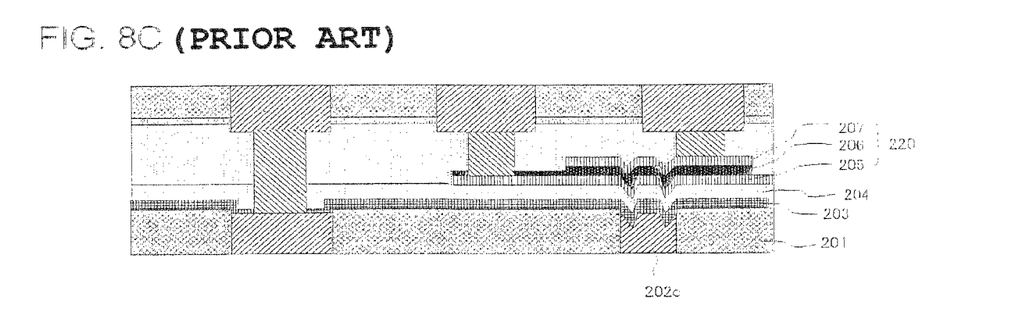

When the MIM type capacitor element is formed on the interconnect 202a, 202b, 202c having such a steep difference in level directly or via the insulating layer, electrodes 205, 207 of the MIM type capacitor element 220 and a dielectric layer (capacitor insulating layer) 206 also suffer the difference in level, as shown in FIGS. 8A to 8C. FIG. 8A is a cross-sectional view showing a semiconductor device in which the MIM type capacitor element 220 is formed directly on the interconnects 202a, 202b. FIG. 8B is a cross-sectional view showing a semiconductor device in which the MIM type capacitor element 220 is formed on the interconnects 202a, 202b via an insulating layer 204 constituted of a silicon oxide layer. FIG. 8C is a cross-sectional view showing a semiconductor device in which the MIM type capacitor element 220 is formed on the interconnect 202c via the insulating layer 204.

Thus, when the MIM type capacitor element 220 suffers the difference in level, the dielectric layer 206 suffers degradation in reliability, as stated in Japanese Laid-open patent publication No. 2002-353324. More specifically, the breakdown voltage of the dielectric layer 206 is locally degraded. This leads to lowered yield of the MIM type capacitor element 220, as well as to degraded reliability of the same during the use thereof.

According to the present invention, there is provided a semiconductor device comprising a first insulating layer provided on a semiconductor substrate; a conductor buried in the first insulating layer; a second insulating layer provided on the first insulating layer and the conductor; a lower electrode provided on the second insulating layer; a capacitor insulating layer provided in a region on the lower electrode opposing at least a part of the conductor; and an upper electrode provided on the capacitor insulating layer; wherein an interface between the second insulating layer and the lower electrode is generally flat; and a surface of the second insulating layer on the side of the first insulating layer and the conductor includes an uneven portion at a position opposing the capacitor insulating layer.

In the semiconductor device thus constructed, the lower electrode, the capacitor insulating layer and the upper electrode constitute the MIM type capacitor element. Here, the interface between the second insulating layer and the lower electrode is generally flat. Accordingly, although the lower face of the second insulating layer (on the side of the first insulating layer and the conductor) includes the uneven portion, the capacitor element is not thereby affected. Such structure prevents degradation in breakdown voltage of the capacitor insulating layer.

According to the present invention, there is also provided a method of manufacturing a semiconductor device, comprising forming a first insulating layer on a semiconductor substrate; forming a conductor so that the conductor is buried in the first insulating layer; forming a second insulating layer on the first insulating layer and the conductor; planarizing a surface of the second insulating layer; forming a lower electrode on the planarized surface of the second insulating layer; forming a capacitor insulating layer in a region on the lower electrode opposing at least a part of the conductor; and forming an upper electrode on the capacitor insulating layer.

In the manufacturing method thus arranged, the surface of the second insulating layer is planarized before formation of the lower electrode on the second insulating layer. Accordingly, even when the lower face of the second insulating layer includes an uneven portion, the capacitor element formed on the second insulating layer is not thereby affected. Such manufacturing method prevents degradation in breakdown voltage of the capacitor insulating layer.

Thus, the present invention provides a semiconductor device including a MIM type capacitor element that achieves higher yield and offers superior reliability, and a method of manufacturing such semiconductor device.

BRIEF DESCRIPTION OF THE DRAWING

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, exemplary embodiments of a semiconductor device and a method of manufacturing the same according to the present invention will be described in details, referring to the accompanying drawings. In the drawings, same constituents are given the identical numerals, and duplicating description may not be repeated where appropriate.

Figure 1:
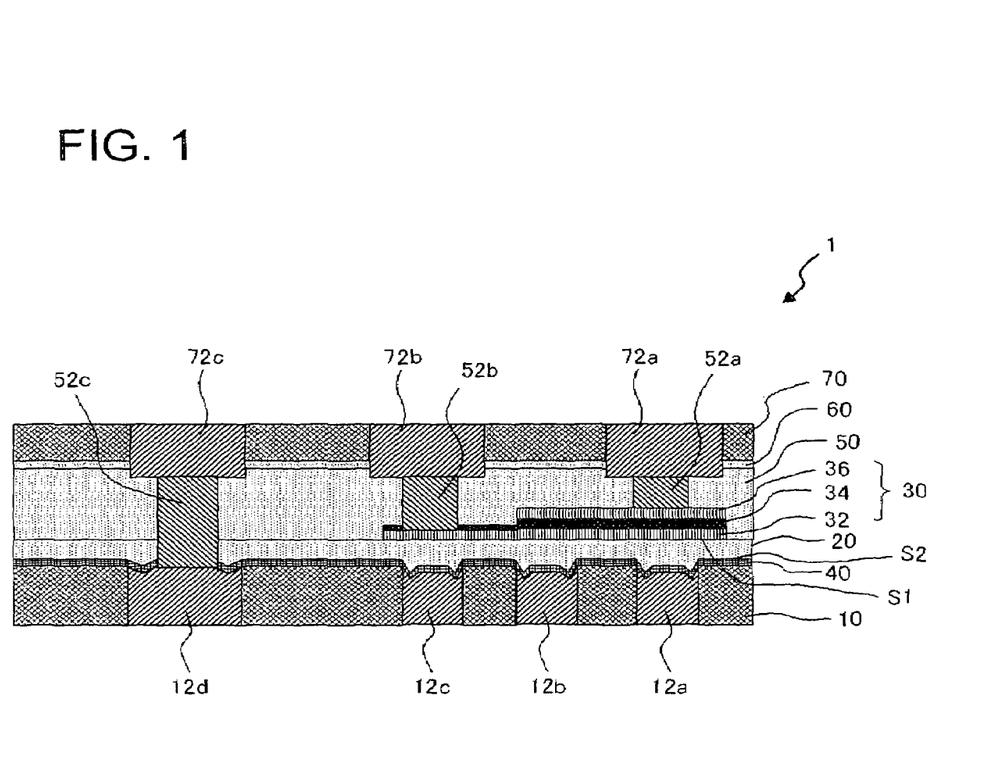
FIG. 1 is a cross-sectional view showing a semiconductor device according to an embodiment of the present invention.

FIG. 1 is a cross-sectional view showing a semiconductor device according to an embodiment of the present invention. The semiconductor device 1 includes an insulating interlayer 10 (first insulating layer), interconnects 12a to 12c (conductor), an insulating interlayer 20 (second insulating layer), and a capacitor element 30. The insulating interlayer 10 is placed on a semiconductor substrate (not shown) such as a silicon substrate, via another insulating interlayer (for example, an insulating interlayer with a contact plug buried therein).

The insulating interlayer 10 (insulating layer between the interconnects) includes the interconnects 12a to 12c buried therein. The interconnects 12a to 12c may be power interconnects. The insulating interlayer 10 also includes, buried therein, an interconnect 12d, in addition to the interconnects 12a to 12c. The interconnect 12d is an interconnect serving for an element other than the capacitor element 30, such as a transistor or a resistance element. In this embodiment, the interconnect 12a to 12d are copper interconnects. Here, along the interface between the insulating interlayer 10 and the respective interconnects 12a to 12d, a barrier metal (not shown) is provided for preventing diffusion of the copper. The insulating interlayer 10 may be a silicon oxide layer.

On the insulating interlayer 10 and the interconnects 12a to 12d, the insulating interlayer 20 is provided via a diffusion barrier 40. The insulating interlayer 20 may be constituted of any material, as long as the material constitutes an insulating layer that accepts planarization by CMP process or the like, and may specifically be a silicon oxide layer. The insulating interlayer 20 may have a thickness of 200 to 400 nm. The diffusion barrier 40 serves to prevent diffusion of the copper, and also as an etching stopper when forming a via plug 52c, to be subsequently described. Suitable materials of the diffusion barrier 40 include SiCN and a silicon nitride film ($SiN_x$). The diffusion barrier 40 may have a thickness of 50 to 150 nm.

On the insulating interlayer 20, the capacitor element 30 is provided. The capacitor element 30 is a MIM type capacitor element, and includes a lower electrode 32 provided on the insulating interlayer 20, a capacitor insulating layer 34 provided on the lower electrode 32, and an upper electrode 36 provided on the capacitor insulating layer 34. The capacitor insulating layer 34 and the upper electrode 36 are smaller in area than the lower electrode 32 in a plan view, and located on a part of the lower electrode 32. The region where the capacitor insulating layer 34 and the upper electrode 36 are located opposes at least a part of the interconnects 12a to 12c (in this embodiment, the interconnects 12a, 12b). In other words, such region overlaps at least a part of the interconnects 12a to 12c in a plan view. Here, although the insulating layer constituting the capacitor insulating layer 34 is provided all over the lower electrode 32, only the portion of the insulating layer interposed between the lower electrode 32 and the upper electrode 36 constitutes the capacitor insulating layer 34. The remaining portion of the insulating layer other than the capacitor insulating layer 34 serves as the etching stopper when forming a via plug 52b.

Suitable materials of the lower electrode 32 include metals such as titanium nitride (TiN), tantalum nitride (TaN) and tungsten nitride (WN). The upper electrode 36 may be constituted of the same material as the lower electrode 32, or a different one. Suitable materials of the capacitor insulating layer 34 include a silicon nitride film, ZrO, TaO and ZrTaO. The capacitor insulating layer 34 may be formed by chemical vapor deposition (hereinafter, CVD) or reactive sputtering. The thickness of the lower electrode 32, the capacitor insulating layer 34 and the upper electrode 36 may be 150 to 300 nm, 10 to 20 nm and 100 to 200 nm, respectively.

Figure 2:
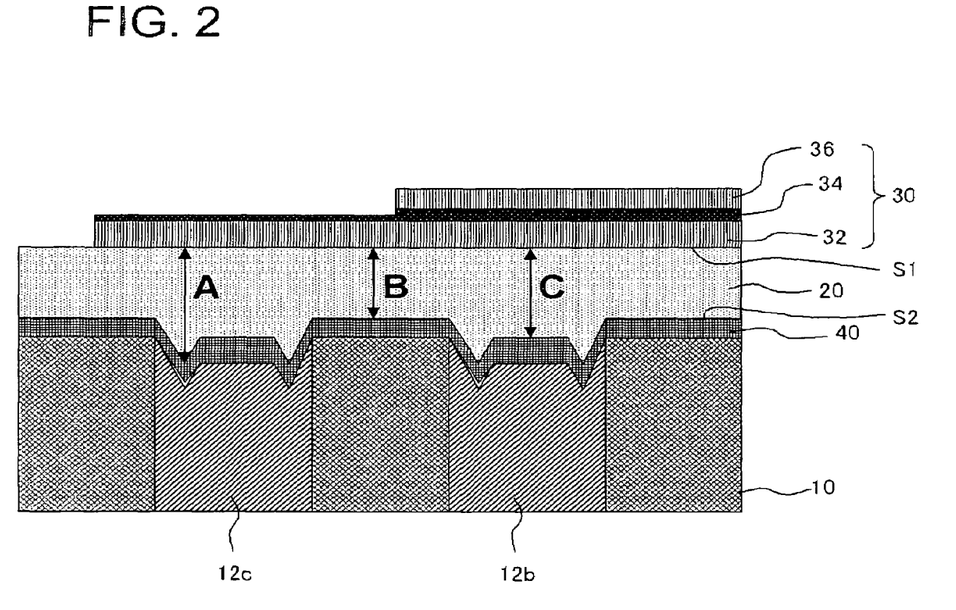
FIG. 2 is an enlarged cross-sectional view showing a part of the semiconductor device of FIG. 1.

Here, the interface S1 between the insulating interlayer 20 and the capacitor element 30 is generally flat. The lower face S2 of the insulating interlayer 20 (on the side of the insulating interlayer 10 and the interconnects 12a to 12c) includes an uneven portion at a position corresponding to the capacitor insulating layer 34. To be more detailed, as shown in FIG. 2, the surface of the interconnects 12*b*, 12*c* is recessed with respect to the surface of the insulating interlayer 10, thereby creating an uneven shape between the respective interconnects and the insulating interlayer 10. Focusing further on the surface of each interconnect, it is understood that a peripheral portion thereof is recessed from the central portion, thus creating a difference in level between the central portion and the peripheral portion. Accordingly, a distance A from the interface S1 to the peripheral portion, a distance B from the interface S1 to the central portion and a distance C from the interface S1 to the insulating interlayer 10 define a relation of B<C<A.

Referring back to FIG. 1, on the insulating interlayer 20, an insulating interlayer 50 (third insulating layer) is provided so as to cover the capacitor element 30. The insulating interlayer 50 may be a silicon oxide layer, and may have a thickness of 500 to 1000 nm. The insulating interlayer 50 includes via plugs 52*a* to 52*c* buried therein. The via plug 52*a* and the via plug 52*b* are connected to the upper electrode 36 and the lower electrode 32 respectively. The via plug 52*c* is connected to the interconnect 12*d*.

On the insulating interlayer 50, an insulating interlayer 70 (fourth insulating layer) is provided via an insulating layer 60. The insulating interlayer 70 may be a silicon oxide layer. The insulating interlayer 70 includes interconnects 72*a* to 72*c* buried therein. The interconnects 72*a*, 72*b* are connected to the via plugs 52*a*, 52*b* respectively. The interconnect 72*c* is connected to the via plug 52*c*. The insulating layer 60 serves as an etching stopper when forming the interconnects 72*a* to 72*c*. Suitable materials of the insulating layer 60 include, similarly to the diffusion barrier 40, SiCN and a silicon nitride film. Preferably, the insulating layer 60 may have a thickness of 50 to 200 nm.

In this embodiment, the via plugs 52*a* to 52*c* and the interconnects 72*a* to 72*c* are, like the interconnects 12*a* to 12*d*, constituted of copper.

Now referring to FIGS. 3A to 4B, a method of manufacturing such semiconductor device 1 will be described, as an embodiment of a method of manufacturing a semiconductor device according to the present invention. Firstly, the insulating interlayer 10 is formed by CVD on a semiconductor substrate (not shown) including transistors and resistance elements. Then the upper surface of the insulating interlayer 10 is planarized by CMP. When the upper surface of the insulating interlayer 10 is already flat upon deposition, this step may be skipped.

Thereafter, a photolithography and a dry etching process are performed to form interconnect trenches for the interconnects 12*a* to 12*d*. The barrier metal (not shown) of tantalum nitride (TaN) is then formed all over in a thickness of approx. 30 to 50 nm, followed by deposition of a copper seed layer in a thickness of 50 to 200 nm, and by an electro plating process to deposit a copper layer in a thickness of 500 to 1000 nm. Then CMP process is performed to polish the copper layer until the upper surface of the insulating interlayer 10 is exposed. At this stage, the interconnects 12*a* to 12*d* are obtained. After that, a sputtering process is performed to form the diffusion barrier 40. When this is completed, a steep difference in level emerges on the interconnects 12*a* to 12*c* and the diffusion barrier 40 formed thereon. The mechanism of formation of the difference in level is as already described referring to FIG. 7.

Figure 3A:
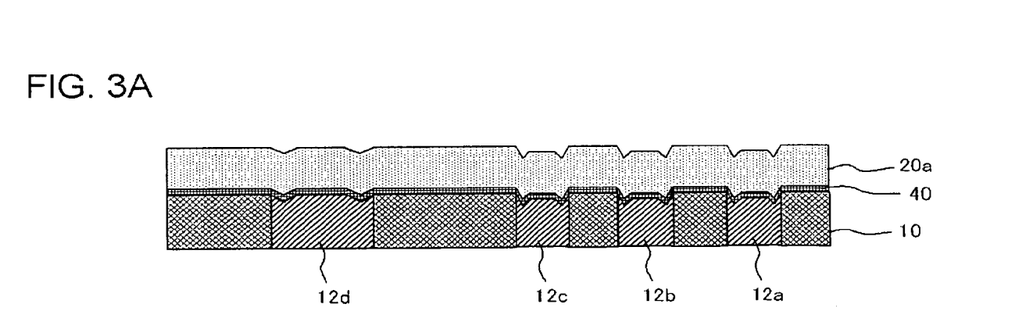
FIGS. 3A and 3B are cross-sectional views progressively showing a method of manufacturing the semiconductor device according to the embodiment of the present invention.

On the diffusion barrier 40, a silicon oxide layer 20*a*, which is to be subsequently made into the insulating interlayer 20, is deposited by CVD process. Upon deposition, the surface of the silicon oxide layer 20*a* includes the steep difference in level like the diffusion barrier 40 (FIG. 3A). The silicon oxide layer 20*a* is then subjected to CMP process for planarization of the surface. The method of the surface planarization is not limited to the CMP process, but instead a photoresist may be applied to the silicon oxide layer 20*a*, after which an etchback process may be performed to remove a portion of the photoresist and of the silicon oxide layer.

Figure 3B:
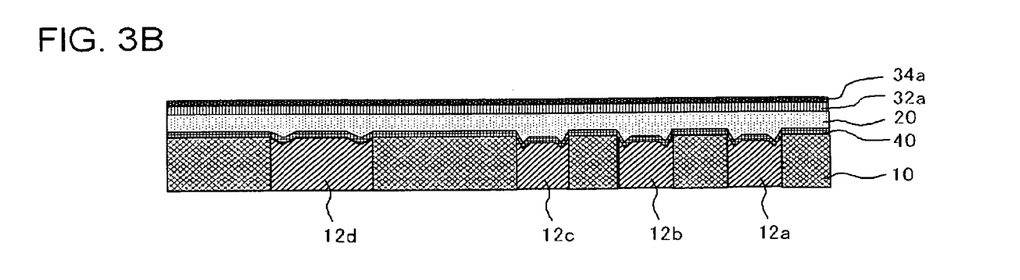

On the insulating interlayer 20 with the surface thus planarized, a titanium nitride layer 32*a* that is to be made into the lower electrode 32, and an insulating layer 34*a* to be made into the capacitor insulating layer 34 are deposited by a sputtering process (FIG. 3B). Then a photolithography and a dry etching process are performed to shape the titanium nitride layer 32*a* and the insulating layer 34*a* into a desired pattern. At this stage, the lower electrode 32 is obtained. Thereafter, a titanium nitride layer 36*a* to be made into the upper electrode 36 is deposited (FIG. 4A), followed by a photolithography and a dry etching process with a mask M1 shown in FIG. 4A to shape the insulating layer 34*a* and the titanium nitride layer 36*a* into a desired pattern. At this stage, the capacitor insulating layer 34 and the upper electrode 36 are obtained.

Figure 4A:
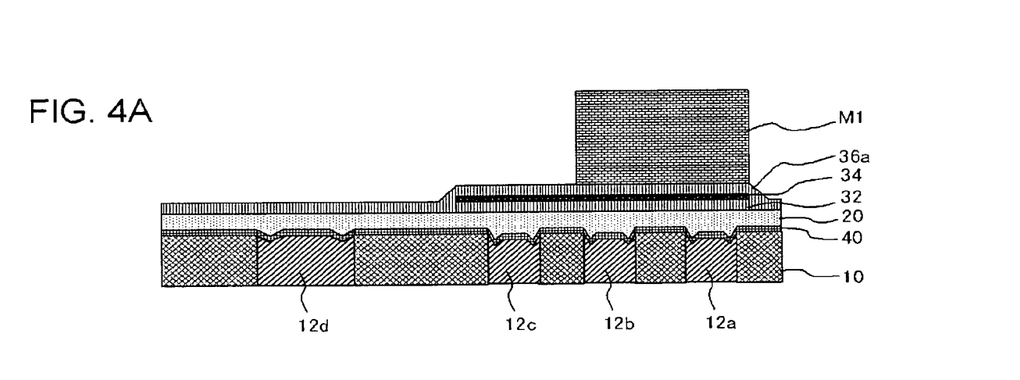
FIGS. 4A and 4B are cross-sectional views progressively showing a method of manufacturing the semiconductor device according to the embodiment of the present invention.
Figure 4B:
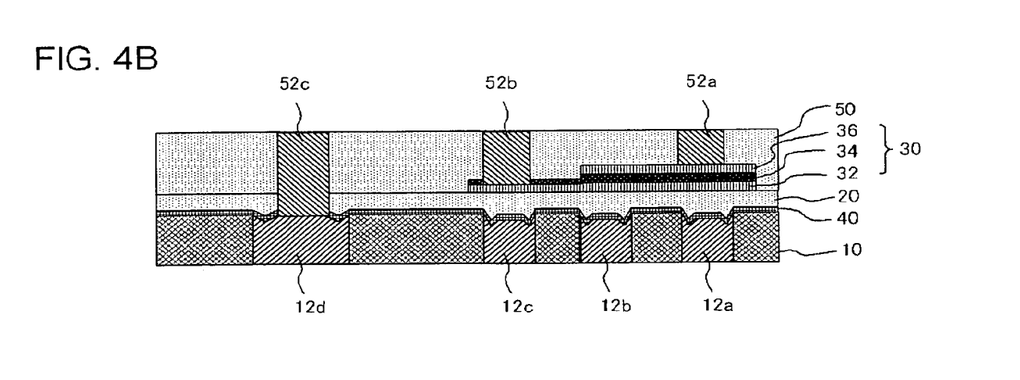

CVD process is then performed to form the insulating interlayer 50 so as to cover the capacitor element 30, followed by CMP process to planarize the surface of the insulating interlayer 50. Here again, a photolithography and a dry etching process are performed to form trenches for the via plugs 52*a*, 52*b*, and 52*c*. After forming a barrier metal, a copper seed layer and a copper layer through a similar process to the formation of the interconnects 12*a* to 12*d*, CMP process is performed to polish the copper layer until the surface of the insulating interlayer 50 is exposed. At this stage, the via plugs 52*a* to 52*c* are obtained (FIG. 4B).

Then the insulating layer 60 is formed on the insulating interlayer 50 and the via plugs 52*a* to 52*c*, by a sputtering process. On the insulating layer 60, the insulating interlayer 70 is formed. Further, after forming interconnect trenches in the insulating interlayer 70 by a photolithography and a dry etching process, the interconnects 72*a* to 72*c* are formed through a similar process to the formation of the interconnects 12*a* to 12*d*. Thus, the semiconductor device 1 shown in FIG. 1 is obtained.

The foregoing embodiment provides the following advantageous effects. In this embodiment, the surface of the insulating interlayer 20 is planarized before the formation of the lower electrode 32 on the insulating interlayer 20. Accordingly, in the semiconductor device 1, interface S1 between the insulating interlayer 20 and the lower electrode 32 is generally flat. Therefore, although the lower face S2 of the insulating interlayer 20 includes the uneven portion, the capacitor element 30 is not thereby affected. Such structure prevents degradation in breakdown voltage of the capacitor insulating layer. Consequently, the foregoing embodiment provides the semiconductor device 1 including the capacitor element 30 that achieves higher yield and offers superior reliability, and the method of manufacturing such semiconductor device 1.

The surface of the interconnects 12*a* to 12*c* is recessed with respect to the surface of the insulating interlayer 10. Accordingly, a distance from the interface S1 to the respective interconnects 12*a* to 12*c* is longer than a distance from the interface S1 to the insulating interlayer 10. Such configuration suppresses the magnitude of an electric field generated between the lower electrode 32 and the interconnects 12*a* to 12*c*, thereby achieving higher breakdown voltage of the insulating interlayer 20. For such purpose, it might be an option to increase the thickness of the insulating interlayer 20. Excessively increasing the thickness of the insulating interlayer 20, however, may complicate the formation of the via plug 52*c*, which is undesirable. In the foregoing embodiment, in contrast, the interface S1 is planarized so that the uneven shape of the lower face S2 of the insulating interlayer 20 is reflected in the thickness of the insulating interlayer 20. Such arrangement permits suppressing the magnitude of the electric field, without complicating the formation process of the via plug 52c.

The interconnects 12a to 12c are copper interconnects, which are formed by Damascene process. In the Damascene process, as already stated, the difference in level is prone to appear on the surface of the insulating interlayer 10 and the interconnects 12a to 12c, and therefore the foregoing embodiment is particularly advantageous because the embodiment protects the capacitor element 30 from the impact that the difference in level could otherwise impose thereon.

The lower electrode 32 is larger in area than the capacitor insulating layer 34 and the upper electrode 36. Accordingly, connecting the via plug 52b to a region in the lower electrode 32 where the capacitor insulating layer 34 and the upper electrode 36 are not present allows contacting the lower electrode 32 from an upper direction of the semiconductor device 1 (from the side of the insulating interlayer 70).

Figure 5:
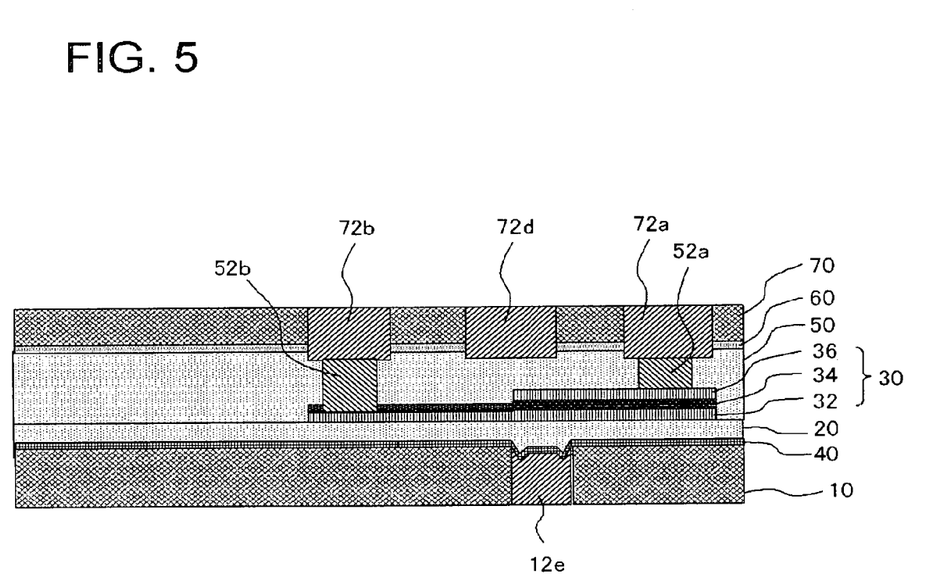
FIG. 5 is a cross-sectional view showing a variation of the semiconductor device.
Figure 6:
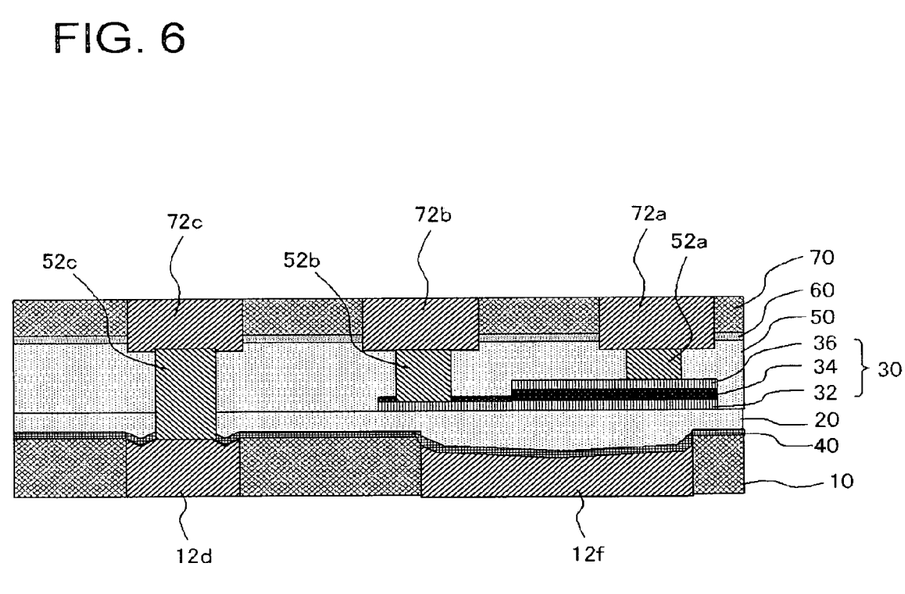
FIG. 6 is a cross-sectional view showing another variation of the semiconductor device.

The semiconductor device and the manufacturing method thereof according to the present invention are not limited to the foregoing embodiment, but various modifications may be made. To cite a few examples, just one interconnect may be disposed so as to oppose the capacitor insulating layer 34, as shown in FIGS. 5 and 6. In these drawings, the capacitor insulating layer 34 is located in a region opposing an interconnect 12e and an interconnect 12f, respectively. The capacitor insulating layer 34 may oppose the entirety of the interconnect 12e as shown in FIG. 5, or may oppose a part of the interconnect 12f as shown in FIG. 6. Here, in FIG. 5 an interconnect 72d connected to an element other than the capacitor element 30 is provided between the interconnect 72a and the interconnect 72b.

Although the conductor is represented by the interconnect in the embodiment, the conductor may be a dummy contact plug, without limitation to the interconnect. The conductor may be constituted of a metal predominantly containing copper, with addition of aluminum or gold, without limitation to the copper. It is to be noted that the copper herein referred to includes a "metal predominantly containing copper".

Although the first to the fourth insulating layer are represented by the silicon oxide layer in the embodiment, the insulating layers may be a SiOF, an organic low-k layer or an inorganic low-k layer, or a composite layer thereof, without limitation to the silicon oxide layer.

Further, although the embodiment provides a method including individually forming the via plug (via plugs 52a to 52c) and the interconnect (interconnects 72a to 72c) by single-Damascene process, dual-Damascene process may be employed to collectively form the via plugs and the interconnects at a time.

It is apparent that the present invention is not limited to the above embodiment, and may be modified and changed without departing from the scope and spirit of the invention.

What is claimed is:

1. A semiconductor device comprising:
    a first insulating layer provided on a semiconductor substrate having a first height;
    a conductor buried in said first insulating layer having a second height different from said first height;
    a second insulating layer provided on said first insulating layer and said conductor, wherein a first surface of said second insulating layer corresponds to said first and second heights and a second surface, opposite said first surface, is generally flat;
    a lower electrode provided on said second surface of said second insulating layer;
    a capacitor insulating layer provided in a region on said lower electrode opposing at least a part of said conductor; and
    an upper electrode provided on said capacitor insulating layer,
    wherein said lower electrode is electrically insulated against said conductor under said lower electrode.
2. The semiconductor device according to claim 1, wherein said second height of said conductor is less than said first height of said first insulating layer.
3. The semiconductor device according to claim 1, wherein said second insulating layer is provided on said first insulating layer and said conductor, via a diffusion barrier.
4. The semiconductor device according to claim 1, wherein said conductor is a power interconnect.
5. The semiconductor device according to claim 1, wherein said conductor is a metal predominantly containing copper.

* * * * *